United States Patent
Ramappa et al.

(10) Patent No.: US 8,187,979 B2
(45) Date of Patent: May 29, 2012

(54) WORKPIECE PATTERNING WITH PLASMA SHEATH MODULATION

(75) Inventors: Deepak A. Ramappa, Cambridge, MA (US); Ludovic Godet, North Reading, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 278 days.

(21) Appl. No.: 12/646,407

(22) Filed: Dec. 23, 2009

(65) Prior Publication Data
US 2011/0151610 A1    Jun. 23, 2011

(51) Int. Cl.
*H01L 31/18*    (2006.01)
(52) U.S. Cl. ......... 438/710; 438/71; 136/250; 136/256
(58) Field of Classification Search .............. 219/121.36
See application file for complete search history.

(56) References Cited

U.S. PATENT DOCUMENTS

| | | | |
|---|---|---|---|
| 5,035,770 | A | 7/1991 | Braun |
| 7,767,977 | B1 | 8/2010 | Godet et al. |
| 2007/0251919 | A1 | 11/2007 | Imai |
| 2008/0006319 | A1* | 1/2008 | Bettge et al. ............. 136/244 |
| 2008/0179546 | A1 | 7/2008 | Lee et al. |
| 2009/0101202 | A1* | 4/2009 | Sun et al. ............. 136/256 |
| 2009/0293931 | A1 | 12/2009 | Petti |
| 2010/0255665 | A1 | 10/2010 | Godet et al. |
| 2010/0255683 | A1 | 10/2010 | Godet et al. |

FOREIGN PATENT DOCUMENTS

WO    2010040805 A1    4/2010

* cited by examiner

*Primary Examiner* — Zandra V. Smith
*Assistant Examiner* — Pamela E Perkins

(57) ABSTRACT

Methods to texture or fabricate workpieces are disclosed. The workpiece may be, for example, a solar cell. This texturing may involve etching or localized sputtering using a plasma where a shape of a boundary between the plasma and the plasma sheath is modified with an insulating modifier. The workpiece may be rotated in between etching or sputtering steps to form pyramids. Regions of the workpiece also may be etched or sputtered with ions formed from a plasma adjusted by an insulating modifier and doped. A metal layer may be formed on these doped regions.

19 Claims, 9 Drawing Sheets

WORKPIECE PATTERNING WITH PLASMA SHEATH MODULATION

FIELD

This invention relates to fabricating a workpiece and, more particularly, to fabricating a workpiece by processing with a plasma focused by an insulating modifier.

BACKGROUND

Workpieces, such as semiconductor wafers or solar cells, typically require multiple process steps to fabricate a finished product. For example, besides forming a p-n junction in a solar cell, material layers may be deposited on the solar cell to enhance performance or improve efficiency. Texturing the surface, cleaning, or adding metal layers to the surface of the solar cell also may be performed.

"Black silicon" may be used in solar cells. This is a specific type of silicon that absorbs a large percentage of the solar spectrum and can enable more efficient solar cells. It is referred to as "black" because it appears black to a viewer due to the wavelengths absorbed and its low reflection. The high light absorption of black silicon is due to its particular surface texture. FIGS. 1A-1B are images of one type of black silicon or textured silicon. FIG. 1A is a scanning electron microscope (SEM) image of black silicon. The textured pattern seen in FIG. 1A is created by femto laser-based fluorinated chemistry etching of the silicon surface. FIG. 1B is the surface of a textured silicon workpiece. Texturing the surface with, for example, pyramid shapes increases light collection. Known wet chemistry processes, however, are limited by the crystal plane of the workpiece being etched and the etch rate of a particular crystal plane. Besides this limitation, wet etching, such as the use of KOH, or plasma etching creates random pyramid patterns.

FIG. 2 is a cross-sectional view of a selective emitter solar cell. The selective emitter solar cell 200 has, in this particular embodiment, an n-type base 201 on a base 202. Near the base 202 are n++ regions 203. Opposite the base 202 is a p+ layer 204 and anti-reflective coating (ARC) 205. The ARC 205 may be $SiN_x$ in one instance. Metal contacts 206 are disposed in the selective emitter solar cell 200 near the p++ regions 207. The n++ regions 203, p++ regions 207, and p+ layer 204 may be formed by doping. The surface 208 of the selective emitter solar cell 200 may be textured similar to those illustrated in FIGS. 1A-1B. An oxide layer between the ARC 205 and p+ layer 204 may be used in one embodiment.

FIG. 3 is a cross-sectional view of an interdigitated back contact (IBC) solar cell. The IBC solar cell 300 in this particular embodiment includes an n-type base 301, an n+ layer 302, and an ARC 205. An oxide layer between the ARC 205 and n+ layer 302 may be used in one embodiment. Opposite the n+ layer 302 are alternating p+ emitters 303 and n+ back surface fields 304. A passivating layer 305 defines contact holes 306. Alternating n-type contacts 307 and p-type contacts 308 contact the p+ emitters 303 and n+ back surface fields 304. In the embodiments of FIGS. 2-3, the n-type and p-type doping may be reversed or modified.

The patterning of the layers or doping of particular regions in the solar cell, such as the selective emitter solar cell 200 of FIG. 2 or the IBC solar cell 300 of FIG. 3, and formation of metal layers or contacts may be an expensive process. The complexity or number of process steps may increase the cost of ownership and fabrication time. If at least some processes used for fabricating a solar cell or other workpiece were performed in the same system, throughput may be increased and cost per workpiece may be decreased. Eliminating or simplifying steps likewise increases throughput and decreases cost per workpiece. Accordingly, there is a need in the art for an improved method of fabricating a workpiece and, more particularly, of fabricating a workpiece by processing with a plasma focused by an insulating modifier.

SUMMARY

According to a first aspect of the invention, a method to process a workpiece is provided. The method comprises generating a plasma having a plasma sheath proximate a surface of the workpiece. A shape of a boundary between the plasma and the plasma sheath is controlled such that a portion of the shape is not parallel to the surface of the workpiece. A first portion of the surface of the workpiece is removed with the plasma. The surface is parallel to a plane. The workpiece is rotated in a direction parallel to the plane. A second portion of the surface of the workpiece is removed with the plasma.

According to a second aspect of the invention, a method to fabricate a workpiece is provided. The method comprises generating a plasma having a plasma sheath proximate a surface of the workpiece. A shape of a boundary between the plasma and the plasma sheath is controlled such that a portion of the shape is not parallel to the surface of the workpiece. A region of the surface of the workpiece is removed with the plasma and the region of the workpiece is doped.

According to a third aspect of the invention, a method to fabricate a solar cell is provided. The method comprises texturing at least a first region of a surface of the solar cell. The surface of the solar cell is implanted with a dopant. At least one second region of the surface of the solar cell is removed with a plasma. The plasma, which has a plasma sheath, is generated and a shape of a boundary between the plasma and the plasma sheath is controlled such that a portion of the shape is not parallel to the surface of the solar cell. The second region of the solar cell is doped and a metal layer is formed on the second region.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments are described herein in connection with solar cells. However, the embodiments described herein can be used with other workpieces, such as semiconductor wafers. While a selective emitter solar cell and IBC solar cell are specifically disclosed, the embodiments herein may be applied to any other solar cell design. The processing with a plasma focused by an insulating modifier may include, for example, etching, sputtering, deposition, surface texturing, localized doping, or other material modification of the workpiece. While etching and sputtering are specifically described as mechanisms to remove portions of a workpiece, other mechanisms are possible. Thus, the invention is not limited to the specific embodiments described below.

Figure 1A:
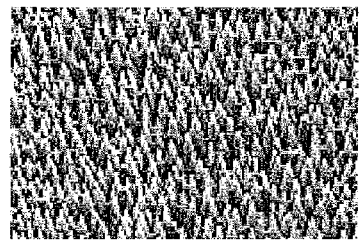
FIGS. 1A-1B are images of one type of black silicon or textured silicon.
Figure 1B:
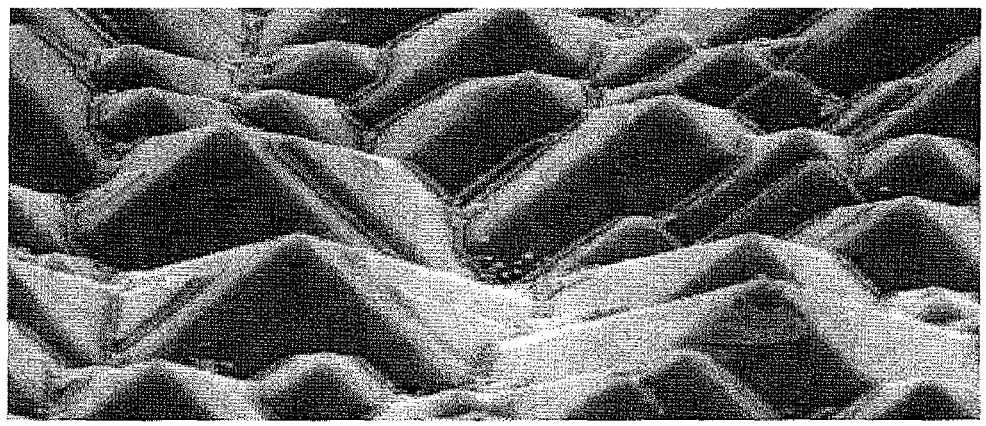
Figure 2:
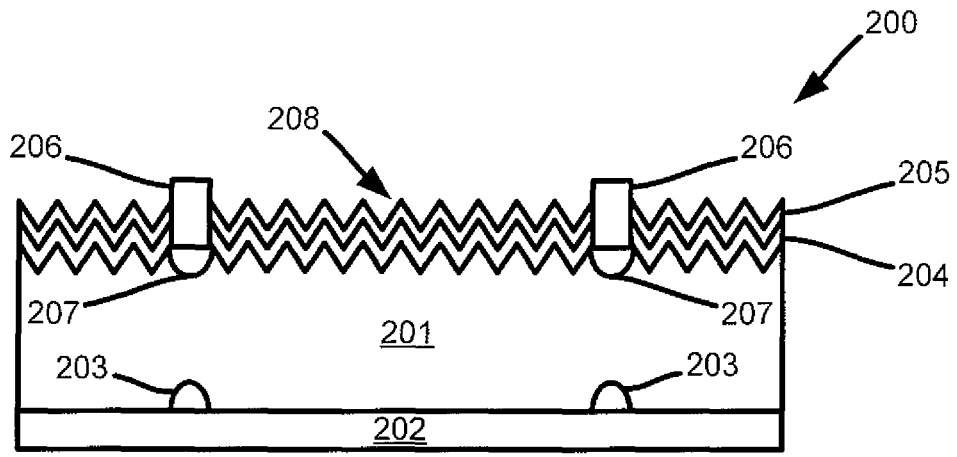
FIG. 2 is a cross-sectional view of a selective emitter solar cell.
Figure 3:
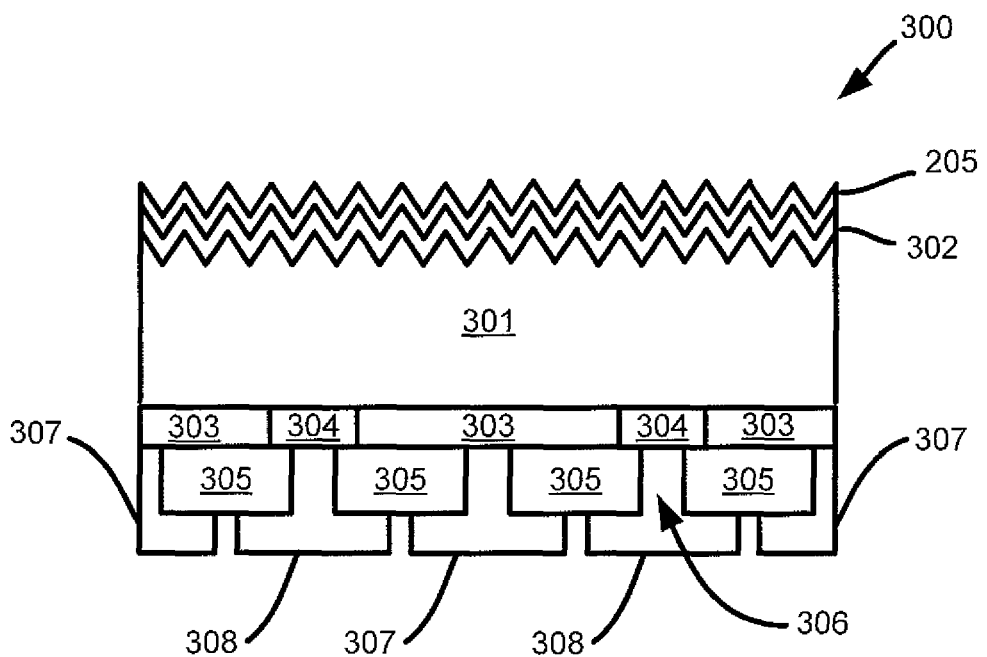
FIG. 3 is a cross-sectional view of an interdigitated back contact solar cell.
Figure 4:
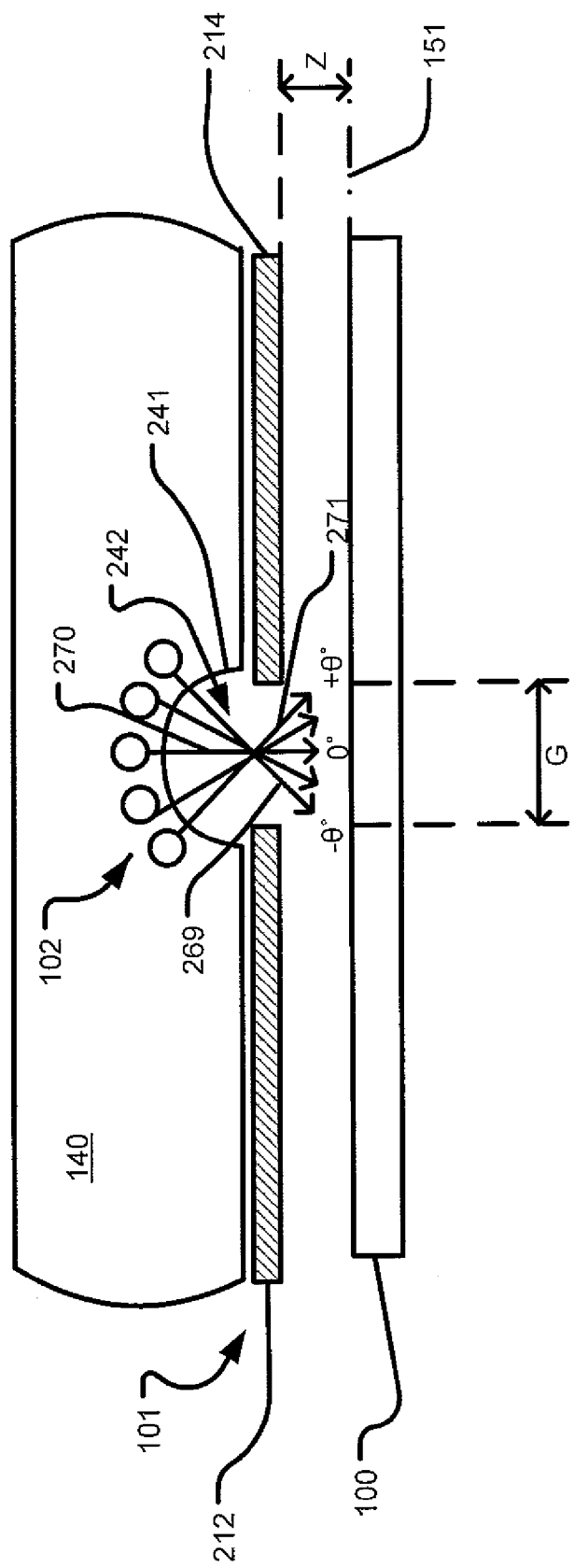
FIG. 4 is a block diagram of a plasma processing apparatus having a insulating modifier.

FIG. 4 is a block diagram of a plasma processing apparatus having a insulating modifier. The plasma 140 is generated as is known in the art. This plasma 140 is generally a quasi-neutral collection of ions and electrons. The ions typically have a positive charge while the electrons have a negative charge. The plasma 140 may have an electric field of, for example, approximately 0 V/cm in the bulk of the plasma 140. In a system containing the plasma 140, ions 102 from the plasma 140 are attracted toward a workpiece 100. These ions 102 may be attracted with sufficient energy to be implanted into the workpiece 100. The plasma 140 is bounded by a region proximate the workpiece 100 referred to as a plasma sheath 242. The plasma sheath 242 is a region that has fewer electrons than the plasma 140. Hence, the differences between the negative and positive charges cause a sheath potential in the plasma sheath 242. The light emission from this plasma sheath 242 is less intense than the plasma 140 because fewer electrons are present and, hence, few excitation-relaxation collisions occur. Thus, the plasma sheath 242 is sometimes referred to as "dark space."

The insulating modifier 101 is configured to modify an electric field within the plasma sheath 242 to control a shape of a boundary 241 between the plasma 140 and the plasma sheath 242. Accordingly, ions 102 that are attracted from the plasma 140 across the plasma sheath 242 may strike the workpiece 100 at a large range of incident angles. The ions 102 may be reactive or non-reactive. This insulating modifier 101 may be referred to as, for example, a focusing plate or sheath engineering plate.

In the embodiment of FIG. 4, the insulating modifier 101 includes a pair of panels 212 and 214 defining an aperture there between having a horizontal spacing (G). The panels 212 and 214 may be an insulator. In other embodiments, the insulating modifier 101 may include only one panel or more than two panels. The panels 212 and 214 may be a pair of sheets having a thin, flat shape. In other embodiments, the panels 212 and 214 may be other shapes such as tube-shaped, wedge-shaped, and/or have a beveled edge proximate the aperture. The panels 212 and 214 also may be positioned a vertical spacing (Z) above the plane 151 defined by the front surface of the workpiece 100. In one embodiment, the vertical spacing (Z) may be about 1.0 to 10.0 mm.

Ions 102 may be attracted from the plasma 140 across the plasma sheath 242 by different mechanisms. In one instance, the workpiece 100 is biased to attract ions 102 from the plasma 140 across the plasma sheath 242. In another instance, a plasma source that generates the plasma 140 and walls surrounding the plasma 140 are biased positively and the workpiece 100 may be grounded. The biasing may be pulsed in one particular embodiment. In yet another instance, electric or magnetic fields are used to attract ions 102 from the plasma 140 toward the workpiece 100.

Advantageously, the insulating modifier 101 modifies the electric field within the plasma sheath 242 to control a shape of the boundary 241 between the plasma 140 and the plasma sheath 242. The boundary 241 between the plasma 140 and the plasma sheath 242 may have a convex shape relative to the plane 151 in one instance. When the workpiece 100 is biased, for example, the ions 102 are attracted across the plasma sheath 242 through the aperture between the panels 212 and 214 at a large range of incident angles. For instance, ions following trajectory path 271 may strike the workpiece 100 at an angle of $+\theta°$ relative to the plane 151. Ions following trajectory path 270 may strike the workpiece 100 at about an angle of 0° relative to the same plane 151. Ions following trajectory path 269 may strike the workpiece 100 an angle of $-\theta°$ relative to the plane 151. Accordingly, the range of incident angles may be between $+\theta°$ and $-\theta°$ centered about 0°. In addition, some ion trajectories paths such as paths 269 and 271 may cross each other. Depending on a number of factors including, but not limited to, the horizontal spacing (G) between the panels 212 and 214, the vertical spacing (Z) of the panels 212 and 214 above the plane 151, the dielectric constant of the panels 212 and 214, or other process parameters of the plasma 140, the range of incident angles ($\theta$) may be between +60° and −60° centered about 0°.

Figure 5:
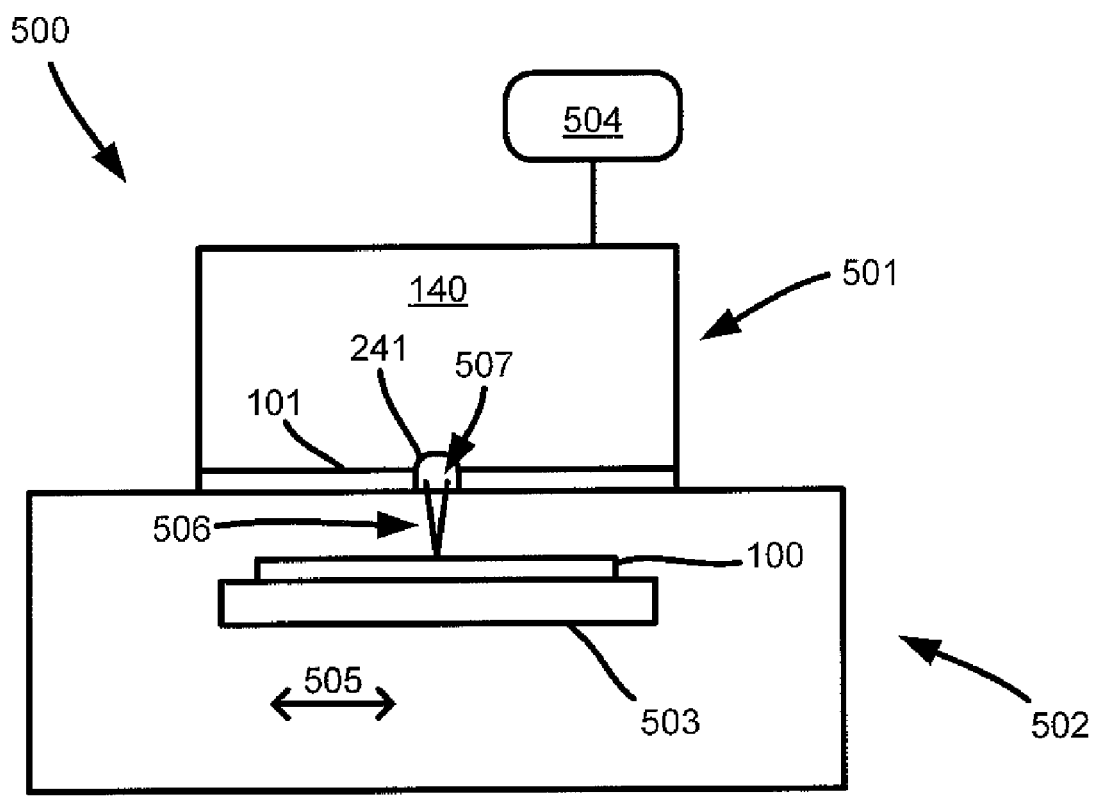
FIG. 5 is a block diagram of a plasma processing apparatus consistent with an embodiment of the disclosure.

FIG. 5 is a block diagram of a plasma processing apparatus consistent with an embodiment of the disclosure. The system 500 includes a plasma source 501, a insulating modifier 101, and a process chamber 502. A gas source 504 is connected to the plasma source 501. The plasma source 501 or other components of the system 500 also may be connected to a pump, such as a turbopump. The plasma source 501 that generates the plasma 140 may be, for example, an RF plasma source, inductively-coupled plasma (ICP) source, indirectly heated cathode (IHC), capacitively-coupled plasma (CCP) source, helicon plasma source, microwave plasma source, or other plasma sources known to those skilled in the art. The process chamber 502, plasma source 501, or platen 503 may be grounded.

The insulating modifier 101 is used to focus ions 506 for implantation, etching, or sputtering of a workpiece 100. This extraction of the plasma 140 from the plasma source 501 into the ions 506 may be continuous (DC) or pulsed. The plasma source 501 may be biased in one instance. Alternatively, an RF bias in the system 500 may or may not be pulsed. The insulating modifier 101 has at least one aperture 507, though multiple apertures 507 are possible. Adding more than one aperture 507 may increase throughput of the system 500. Thus, the insulating modifier 101 design is not limited solely to the design illustrated in FIG. 5.

One or more workpieces 100, which may be solar cells or semiconductor wafers, are arranged on a platen 503 in the process chamber 502. The platen 503 may use electrostatic clamping, mechanical clamping, or a combination of electrostatic and mechanical clamping to retain the workpiece 100. The workpiece 100 may be scanned using the platen 503. In the embodiment of FIG. 5, the platen 503 can scan in the direction 505. The platen 503, however, may perform either 1D, 2D, or 3D scanning depending on the desired implant, etch, or sputter pattern on the workpiece 100. In an alternate embodiment, the insulating modifier 101 translates with respect to the workpiece 100. Various load and unload mechanisms may be used to place the workpiece 100 on the platen 503. The platen 503 may be configured to provide backside gas cooling to the workpiece 100 in one instance. The workpiece 100 may be heated or cooled to various temperatures before or during implantation, etching, or sputtering using the platen 503 or some other apparatus.

Figure 6:
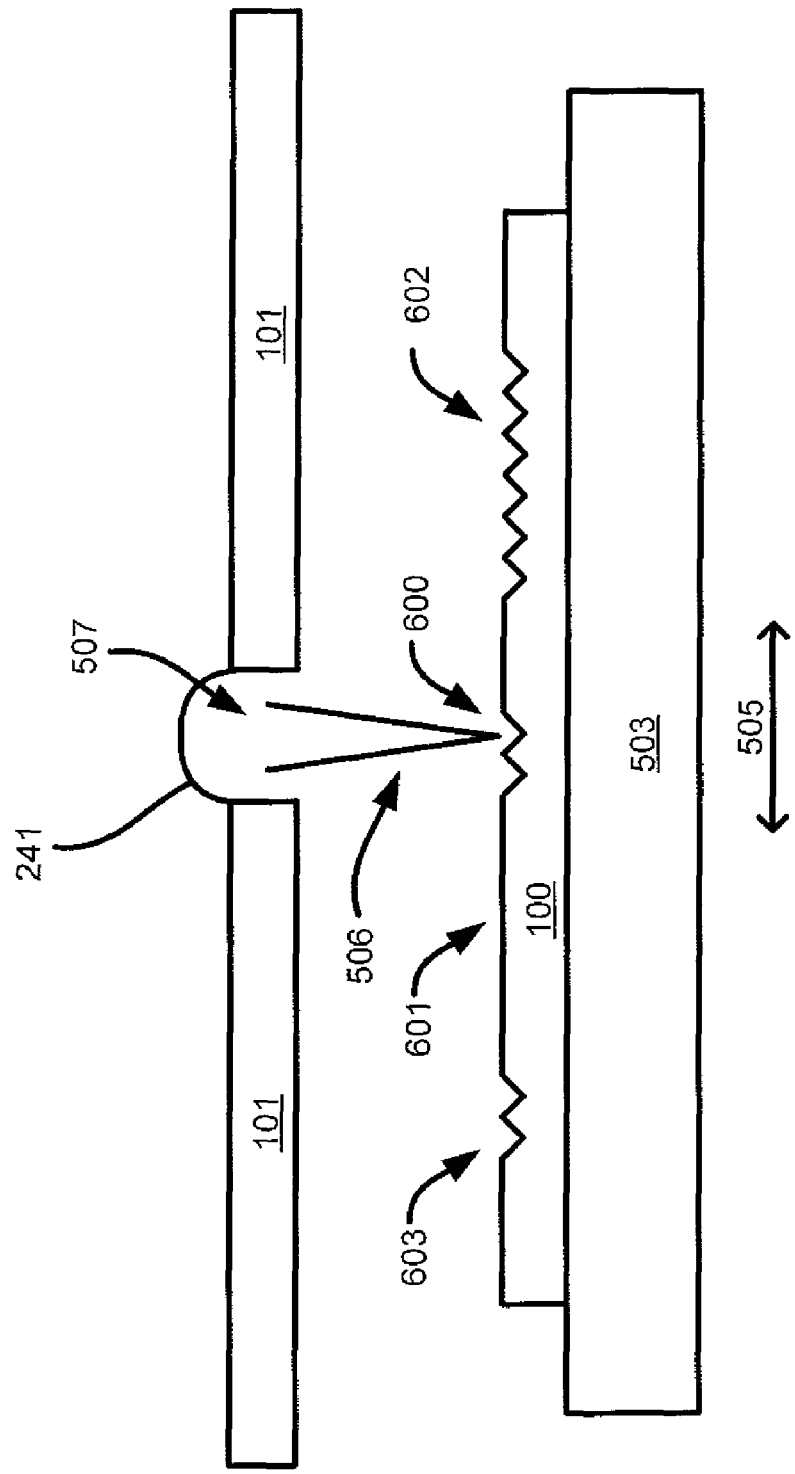
FIG. 6 is a cross-sectional block diagram of localized etching or sputtering of a workpiece.

FIG. 6 is a cross-sectional block diagram of localized etching or sputtering of a workpiece. The workpiece 100 is disposed on the platen 503, which can scan in the direction 505. The ions 506 etch or sputter the workpiece 100 after leaving the aperture 507 in the insulating modifier 101. The ions 506 in FIG. 6 etch or sputter the first region 600 of the workpiece 100. This etching or sputtering removes some of the workpiece 100 in the first region 600. As the workpiece 100 moves in the direction 505, the second region 602 and the third region 603 also are etched or sputtered. Surface 601, for example, is not etched or sputtered. Various etch or sputter patterns of the workpiece 100 may be performed besides that illustrated in FIG. 6. Creating a surface 601 that is not etched or sputtered may involve adjusting the translation of the workpiece 100, adjusting the bias to the platen 503 or workpiece 100, changing the pulse width or frequency, or changing the parameters of the ions 506. In another instance, the workpiece 100 is translated with respect to the insulating modifier 101 in the x, y, or z directions to enable a surface 601. Such a surface 601 may be used to create, for example, contacts in a solar cell.

Figure 7:
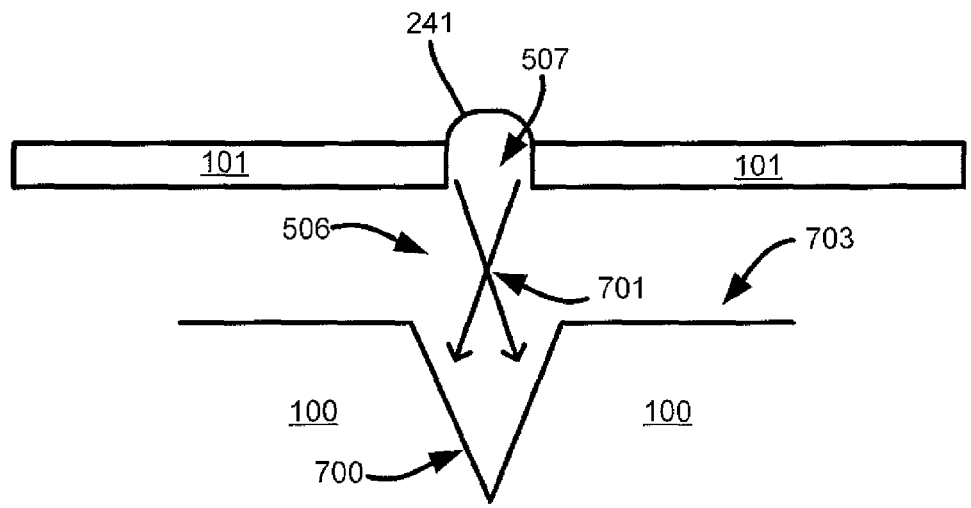
FIG. 7 is a cross-sectional side view of texturing a workpiece in a first instance.

A focal point of the ions 506 can be localized near, at, or below a surface of the workpiece 100. FIG. 7 is a cross-sectional side view of texturing a workpiece in a first instance. The ions 506 pass through the aperture 507 of the insulating modifier 101 and etch or sputter the workpiece 100. A groove 700 is formed in the workpiece 100 due to this etching or sputtering. In one instance, the groove 700 may be formed through sputtering action of the ions 506, where the ions 506 remove a portion of the workpiece 100 by force to create the groove 700. The ions 506 also may chemically form the groove 700 through a reaction. In one example, the reaction uses F ions to form volatile $SiF_4$ molecules with the workpiece 100, which may outgas. Other reactions and mechanisms are possible and this embodiment is not solely limited to forming $SiF_4$ molecules.

The groove 700 in this embodiment is v-shaped, though other shapes, such as semi-circular or dome shapes, are possible. The ions 506 have a focus 701 between the insulating modifier 101 and the workpiece 100. Thus, the ions 506 cross each other at the focus 701. Some of the ions 506 impact the workpiece 100 at an angle. In one instance, the majority of the ions 506 do not impact the workpiece 100 perpendicular to the surface 703 of the workpiece 100. Adjusting the distance between the insulating modifier 101 and the surface 703 of the workpiece 100 may affect the position of the focus 701.

Figure 8:
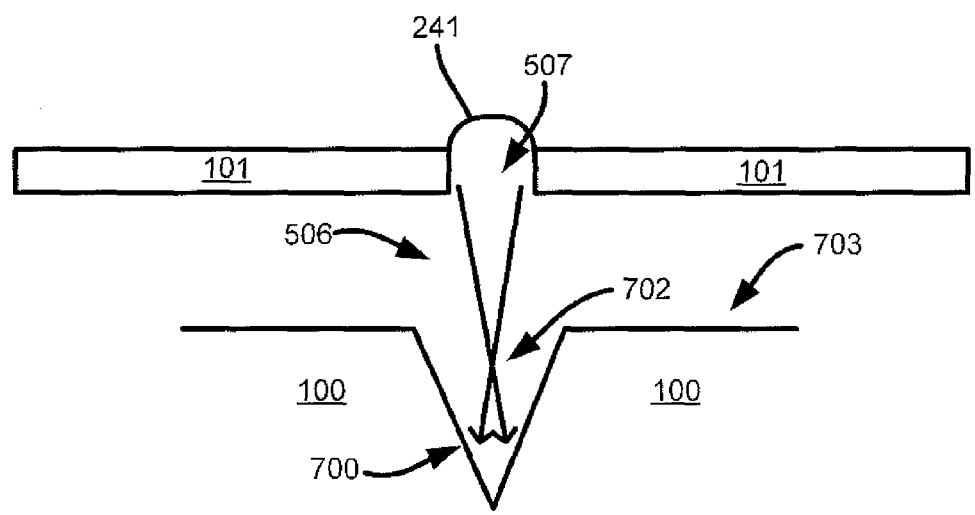
FIG. 8 is a cross-sectional view of texturing a workpiece in a second instance.
Figure 9:
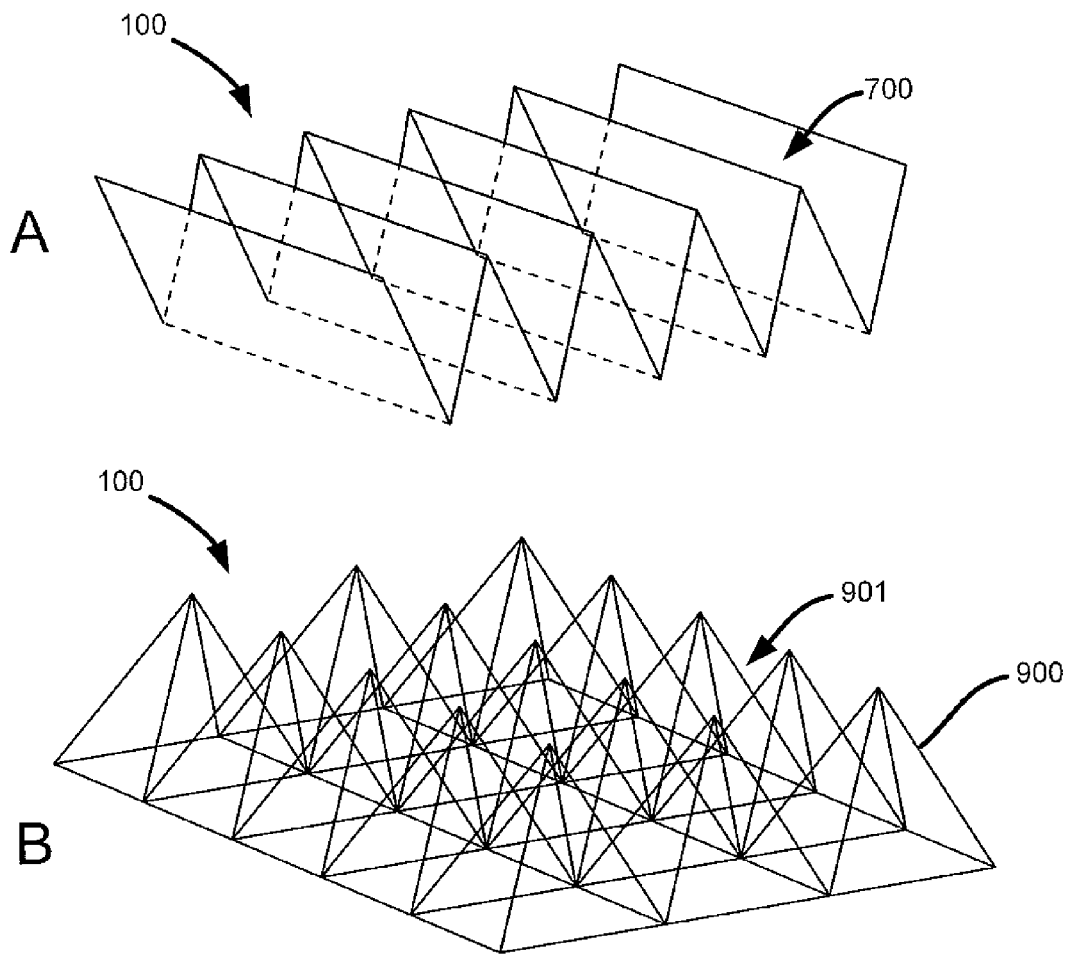
FIGS. 9A-9B are perspective views of etching or sputtering a workpiece to form pyramids.
Figure 10:
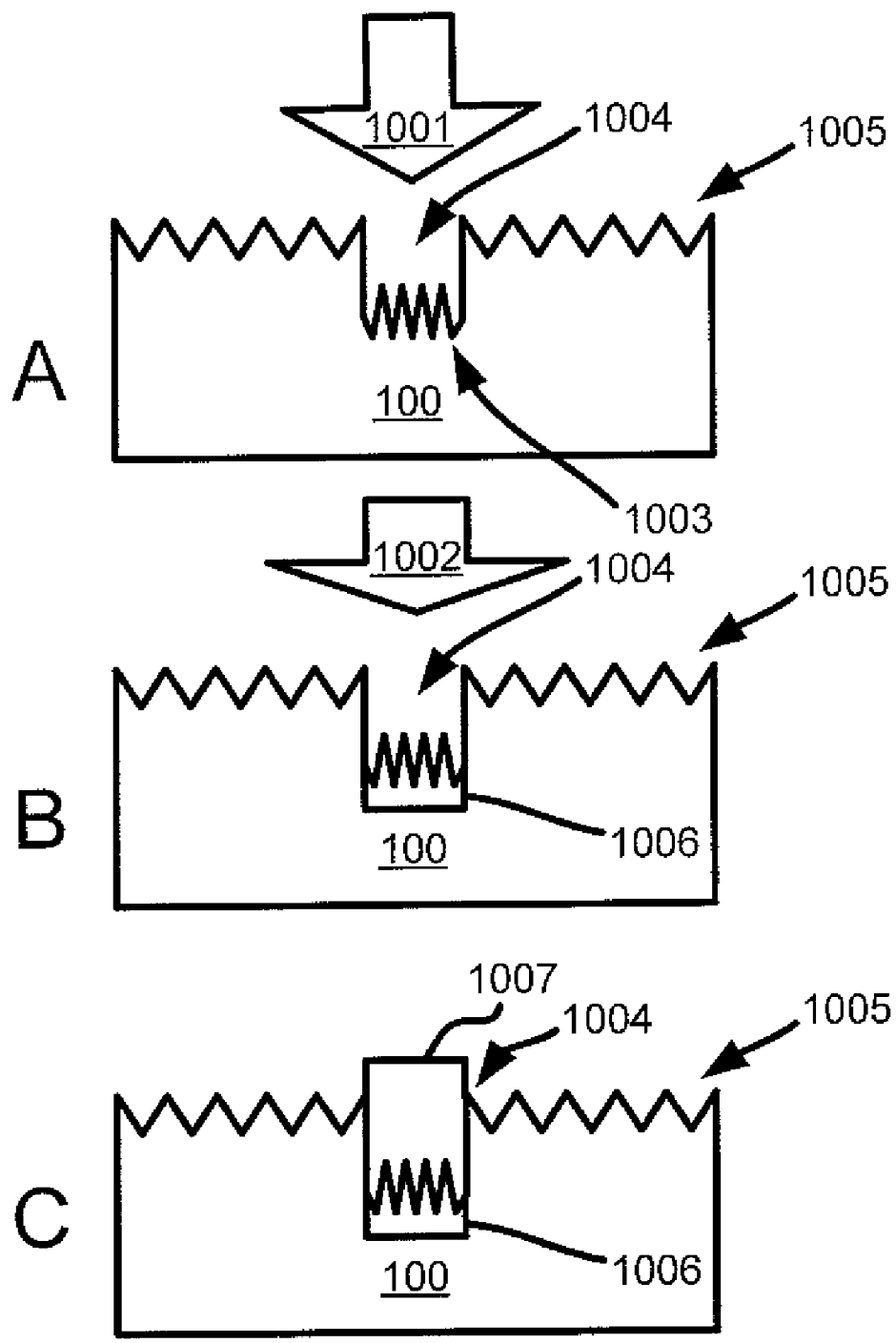
FIGS. 10A-10C are a first embodiment of fabricating a workpiece.
Figure 11:
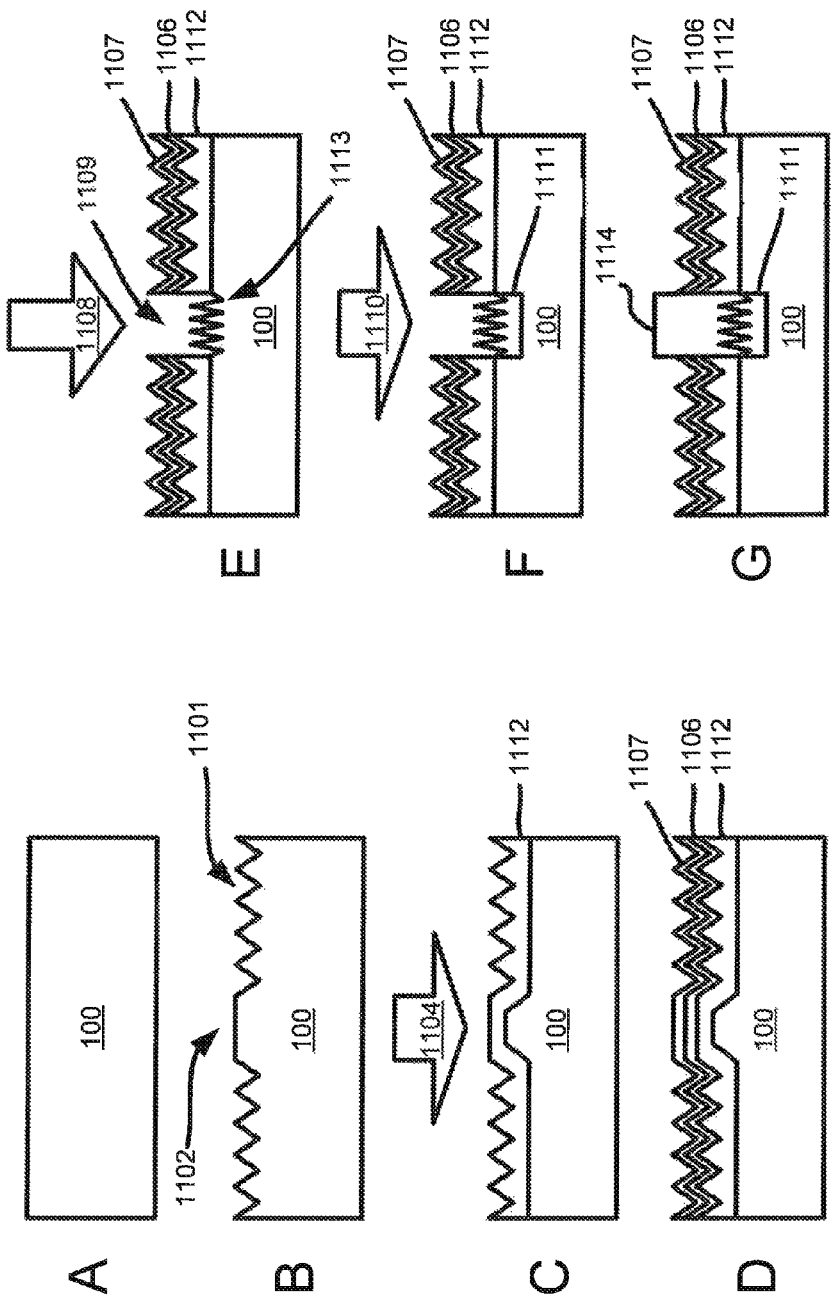
FIGS. 11A-11G are a first embodiment of forming a solar cell.

FIG. 8 is a cross-sectional view of texturing a workpiece in a second instance. In this embodiment, the focus 702 is in the workpiece 100 or below the surface 703 of the workpiece 100. This focus 702 means that some of the ions 506 impact the workpiece 100 at an angle rather than perpendicular to the surface 703 of the workpiece 100. Adjusting the distance between the insulating modifier 101 and the surface 703 of the workpiece 100 may affect the position of the focus 702.

In the embodiments of FIGS. 7-8, the ions 506 may be, for example, H, N, He, other noble gases, F, other inert gases, or other species known to those skilled in the art. Using an inert or noble gas, such as He, may create cavities in the surface of the workpiece 100 around the groove 700. Pockets, or "nanovoids," of inert or noble gas form in the workpiece 100 around this groove 700. These pockets grow in size during an anneal due to, for example, Ostwald ripening or other mechanisms. The larger pockets can trap light and increase absorption of light into the workpiece 100. The workpiece 100 may be, for example, single crystal, polycrystalline, or multicrystalline and may be Si or other materials in the embodiments of FIGS. 4-11.

FIGS. 9A-9B are perspective views of etching or sputtering a workpiece to form pyramids. A series of grooves 700 have been formed in portions of the workpiece 100 by etching or sputtering. This etching or sputtering may use ions and an insulating modifier similar to FIGS. 7-8. One etching or sputtering step may be required for each groove 700. After the grooves 700 are formed in the workpiece 100 in FIG. 9A, the workpiece 100 is rotated. In this instance, the workpiece is rotated or translated 90° with respect to an insulating modifier or a plane parallel to a surface of the workpiece 100, though other rotation or translation amounts are possible. After rotation, the portions of the workpiece 100 are again etched or sputtered. In forming another series of grooves, portions of the grooves 700 illustrated in FIG. 9A are etched or sputtered away. This foinis a series of pyramids 900 and creates pyramid-shaped grooves 901. The pyramid-shaped grooves 901 may only be two v-shaped grooves 700 on top of one another.

The geometry of the grooves 700 and grooves 901 or the slope, shape, uniformity, or dimensions of the pyramids 900 may be controlled so that a large percentage of light impacting the pyramids 900 refracts into the workpiece 100. Any light reflected off the walls of the pyramids 900 is incident on an adjacent wall and will refract into the workpiece 100. Thus, light trapping is improved for workpieces 100 used in, for example, solar cells or light-detecting sensors. The formation of the grooves 700 and grooves 901 is independent of the orientation of the Si or other atoms in the lattice of the workpiece 100. By controlling the angular spread of the ions used to etch or sputter the grooves 700 and grooves 901, precise pyramids 900 may be formed. The depth and width of the grooves 700 and grooves 901 may be adjusted by changing the focus or angle of the ions used to etch or sputter the groove 700 and groove 901.

A wet chemistry process may take more than 20 minutes per batch to form pyramids on a surface of a workpiece. An entire 125 mm workpiece 100 may be textured to form pyramids 900 using a plasma adjusted by an insulating modifier in less than approximately 3 minutes. Furthermore, the formation of the pyramids 900 or other grooves uses focused ions rather than liquid chemicals. This reduces the metal contamination compared to a wet chemistry process. Also, the pyramids 900 may be more uniform using embodiments disclosed herein.

FIGS. 10A-10C are a first embodiment of fabricating a workpiece. Ions 1001, which may use an insulating modifier similar to FIGS. 6-8, etch or sputter a region 1004 of the workpiece 100. The ions 1001 may be, for example, H, N, He, other noble gases, F, other inert gases, or other species known to those skilled in the art. The depth of the etching or sputtering of the region 1004 may be adjusted with the individual workpiece 100. The etching or sputtering of the region 1004 may form v-shaped grooves 1003 using multiple steps, though a single groove or textured region may be formed instead. The surface 1005 in the embodiment of FIG. 10A also has been etched or sputtered to form pyramid shapes similar to FIGS. 9A-B. While etching or sputtering using a plasma and a insulating modifier may be performed, other etching methods likewise may be used to texture the surface 1005.

In FIG. 10B, dopants 1002 implant the workpiece 100. These dopants 1002 may be, for example, B, As, P, Ga, Al, or other dopants known to those skilled in the art. The doping with dopants 1002 forms a doped region 1006 in the region 1004. In one instance, the dopants 1002 are focused into the region 1004 using a plasma and an insulating modifier. In another instance, the workpiece 100 may have an oxide layer and an ARC on the surface 1005 and the dopants 1002 may be implanted using a plasma doping ion implanter, beam-line ion implanter, or by modifying a plasma sheath with an insulating modifier 101. The oxide layer and ARC serve as a mask to the dopants 1002 and prevent implantation except in the region 1004. Other doping methods such as laser doping with a paste containing a dopant, heating a paste containing a dopant, or gaseous diffusion of dopants in a furnace also may be used to create the doped region 1006 either with or without an oxide layer or ARC on the surface 1005.

In FIG. 10C, a metal layer 1007 is placed in the region 1004. This may form a metal contact in a solar cell. The doped region 1006 assists in charge collection in the metal layer 1007. The metal layer 1007 may be formed using, for example, screen printing, an inkjet process, electroplating, or other processes that can lay metal layers 1007. The metal layer 1007 is aligned with the doped region 1006. If electroplating is used to form the metal layer 1007, lithography or clean steps may not be required.

In one particular embodiment, the etching or sputtering of FIG. 10A and doping of FIG. 10B are at least partially simultaneous. In this embodiment, the ions 1001 and dopants 1002 may be combined in a single plasma focused by an insulating modifier. While the ions 1001 etch or sputter, the dopants 1002 dope and form the doped region 1006. For example, the ions 1001 and dopants 1002 used for at least partially simultaneous doping and etching or sputtering may include $BF_3$ and $NF_3$, $BF_3$ and He, P and $NF_3$, $SO_2$ with $NF_3$ and B, $SO_2$ with $NF_3$ and P, or $B_2H_6$ with either He, $H_2$, or Ar. Of course, other combinations of ions 1001 and dopants 1002 are possible. The ions 1001 may be, for example, H, N, He, other noble gases, F, other inert gases, or other species known to those skilled in the art. The dopants 1002 may be, for example, B, As, P, Ga, Al, or other dopants known to those skilled in the art FIGS. 11A-11G are a first embodiment of forming a solar cell. The workpiece 100, which may be an Si substrate, is illustrated in FIG. 11A. In FIG. 11B, the workpiece 100 has been textured. This texturing forms textured surface regions 1101 and untextured surface regions 1102. The textured surface regions 1101 may be pyramids and may be formed using a focused plasma as illustrated in FIGS. 9A-9B, plasma etching, localized plasma sputtering, chemical etching, or laser texturing. In FIG. 11C, dopants 1104 dope the workpiece 100 and form a first doped region 1112. These dopants 1104 may be, for example, B, As, P, Ga, Al, or other dopants known to those skilled in the art. The dopants 1104 may be implanted or diffused into the workpiece 100. In FIG. 11D, an oxide layer 1106 and an ARC 1107 may be added on top of the workpiece 100. The oxide layer 1106 may be formed in a furnace with an oxygen atmosphere and the ARC 1107, which may be $SiN_x$, may be deposited on the workpiece 100. The first doped region 1112 may be activated during the formation of the oxide layer 1106 and ARC 1107.

At least one region 1109 of the workpiece 100 is etched or sputtered in FIG. 11E. Etching or sputtering of more than one region 1109 is possible. This etching or sputtering of the region 1109 will remove part of the workpiece 100 and the ARC 1107, oxide layer 1106, and first doped region 1112, though other etch or sputter depths are possible. The etching or sputtering in FIG. 11E uses ions 1108, which may be H, N, He, other noble gases, other inert gases, F, or other species known to those skilled in the art. The region 1109 is etched or sputtered using the ions 1108 in a manner similar to FIGS. 6-8 in one instance. This etching or sputtering may form v-shaped grooves 1113 using multiple steps, though a single groove or textured region may be formed instead.

The ARC 1107 may only be approximately 400-800 Å in thickness, which may be etched through or sputtered off by the ions 1108.

The region 1109 is then doped in FIG. 11F. The dopants 1110 may be B, As, P, Ga, Al, or other dopants known to those skilled in the art. The dopants 1110 may be implanted using, for example, a plasma doping or beam-line ion implanter, by modifying a plasma sheath with an insulating modifier 101, or by diffusion of dopants. The oxide layer 1106 and ARC 1107 may serve as a mask so that only the second doped region 1111 is formed. The dopants 1110 do not implant the rest of the workpiece 100 due to the presence of the oxide layer 1106 and ARC 1107.

The region 1109 then has a metal layer 1114 formed in it on the second doped region 1111 in FIG. 11G. This metal layer 1114 may be a contact in a solar cell and the second doped region 1111 may assist in charge collection. The metal layer 1114 may be formed using, for example, screen printing, an inkjet process, or electroplating. The metal layer 1114 is aligned with the second doped region 1111. If electroplating is used to form the metal layer 1114, lithography or clean steps may not be required. As with FIGS. 10A-C, ions 1108 and dopants 1110 may be implanted, etched, or sputtered at least partially simultaneously.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method to process a workpiece comprising:
    generating a plasma having a plasma sheath proximate a surface of said workpiece;
    controlling a shape of a boundary between said plasma and said plasma sheath whereby a portion of said shape is not parallel to said surface of said workpiece;
    removing a first portion of said surface of said workpiece with said plasma; and
    removing a second portion of said surface of said workpiece with said plasma, wherein said second portion overlaps with said first portion.

2. The method of claim 1, wherein said workpiece defines a v-shaped groove after said removing said first portion and wherein said workpiece defines a pyramid-shaped groove after said removing said second portion.

3. The method of claim 2, wherein said pyramid-shaped groove comprises a second v-shaped groove on top of said v-shaped groove.

4. The method of claim 1, wherein said workpiece is a solar cell.

5. The method of claim 1, wherein said workpiece comprises Si.

6. The method of claim 1, wherein said removing said first portion and said removing said second portion are performed using a species selected from the group consisting of a noble gas, H, N, and F.

7. The method of claim 1, wherein said surface is parallel to a plane and further comprising rotating said workpiece in a direction parallel to said plane.

8. The method of claim 7, wherein said rotating comprising translating said workpiece 90°.

9. The method of claim 1, wherein ions formed from said plasma have a focus, said focus being either between said plasma sheath and said surface of said workpiece or below said surface of said workpiece.

10. The method of claim 1, wherein said surface of said workpiece is planar.

11. The method of claim 1, further comprising scanning said workpiece during said removing said first portion and said removing said second portion.

12. A method to fabricate a solar cell comprising:
generating a plasma having a plasma sheath proximate a surface of said solar cell;
controlling a shape of a boundary between said plasma and said plasma sheath whereby a portion of said shape is not parallel to said surface of said solar cell;
removing a region of said surface of said solar cell with said plasma, wherein said solar cell has an oxide layer and an anti-reflective coating on said surface and said removing etches through or sputters off said oxide layer and said anti-reflective coating over said region of said surface; and
doping said region of said solar cell.

13. The method of claim 12, wherein said removing and said doping are at least partially simultaneous.

14. The method of claim 13, wherein said removing and said doping use a first species selected from the group consisting of B and P and a second species selected from the group consisting of He and F.

15. The method of claim 12, wherein said removing is performed using a species selected from the group consisting of a noble gas, H, N, and F.

16. A method to fabricate a solar cell comprising:
texturing at least a first region of a surface of said solar cell;
implanting said surface of said solar cell with a dopant;
depositing an anti-reflective coating on said surface of said solar cell;
forming an oxide layer on said surface of said solar cell;
removing at least one second region of said surface of said solar cell with a plasma having a plasma sheath by generating said plasma and controlling a shape of a boundary between said plasma and said plasma sheath whereby a portion of said shape is not parallel to said surface of said solar cell and wherein said removing said at least one second region removes said anti-reflective coating and said oxide layer over said at least one second region;
doping said second region of said solar cell; and
forming a metal layer on said second region.

17. The method of claim 16, wherein said texturing comprises chemical etching, plasma etching, laser texturing, or using a second plasma wherein a second shape of a second boundary between said second plasma and a second plasma sheath is modified whereby a second portion of said second shape is not parallel to said surface of said solar cell.

18. The method of claim 16, wherein said implanting forms a first doped region in said solar cell and wherein said removing said at least one second region removes said first doped region in said at least one second region.

19. The method of claim 16, wherein said removing is performed using a species selected from the group consisting of a noble gas, H, N, and F.

* * * * *